US010620676B1

(12) United States Patent
Tejada et al.

(10) Patent No.: US 10,620,676 B1
(45) Date of Patent: Apr. 14, 2020

(54) WAKE-UP CONTROL CIRCUIT FOR POWER-GATED INTEGRATED CIRCUITS (71) Applicant: Analog Devices Global Unlimited Company, Hamilton (BM)

(72) Inventors: Jose Tejada, Valencia (ES); Cristina Azcona, Villava (ES)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/157,992

(22) Filed: Oct. 11, 2018

(51) Int. Cl.
*G06F 1/26* (2006.01)
(52) U.S. Cl.
CPC ..................... *G06F 1/26* (2013.01)
(58) Field of Classification Search
CPC ..... G06F 1/24; G06F 1/26; G06F 1/30; G06F 1/32; G06F 1/3203; H03K 3/012; H03K 17/22; H03K 17/223; H03K 17/226
USPC .................................................. 327/142, 143
See application file for complete search history.

(56) References Cited

U.S. PATENT DOCUMENTS

| | | |
|---|---|---|
| 6,593,845 B1 | 7/2003 | Friedman et al. |
| 6,906,553 B1 | 6/2005 | Wert |
| 7,417,877 B2 | 8/2008 | Leung et al. |
| 7,602,222 B2 | 10/2009 | Pyeon et al. |
| 7,605,644 B2 | 10/2009 | Idgunji et al. |
| 7,948,263 B2 | 5/2011 | Kim et al. |
| 8,542,054 B2 | 9/2013 | Takayanagi et al. |
| 8,884,687 B2 | 11/2014 | Yoon et al. |
| 9,331,865 B2 | 5/2016 | De Haas |
| 9,337,825 B2 | 5/2016 | Takayanagi et al. |
| 9,496,863 B2 | 11/2016 | Jeon |
| 9,825,642 B2 | 11/2017 | Chellappa et al. |
| 2004/0119517 A1 | 6/2004 | Pauletti et al. |
| 2005/0231244 A1* | 10/2005 | Hartfiel ..................... G06F 1/12 327/141 |
| 2006/0176040 A1 | 8/2006 | Kernahan et al. |
| 2008/0272809 A1 | 11/2008 | Idgunji et al. |
| 2009/0072894 A1 | 3/2009 | Sugimoto |
| 2009/0115258 A1 | 5/2009 | Flynn et al. |
| 2009/0158073 A1 | 6/2009 | Hsieh et al. |
| 2010/0156458 A1 | 6/2010 | Speers |
| 2011/0074472 A1* | 3/2011 | Kawasaki .............. H02H 9/005 327/143 |

(Continued)

FOREIGN PATENT DOCUMENTS

JP 2008072566 A 3/2008
KR 100703720 B1 3/2007

OTHER PUBLICATIONS

Jeong, Seokhyeon, et al., "A 5.8 nW CMOS Wake-Up Timer for Ultra-Low-Power Wireless Applications", IEEE Journal of Solid-State Circuits, vol. 50, No. 8, (Aug. 2015), 10 pgs.

(Continued)

*Primary Examiner* — Tomi Skibinski
(74) *Attorney, Agent, or Firm* — Schwegman Lundberg & Woessner, P.A.

(57) ABSTRACT

A power gating circuit includes a first transistor to couple a power supply to a gated power rail after receiving a control signal. The power gating circuit also includes two or more transistors coupled in parallel with the first switch, the one or more transistors configured to sequentially couple the power supply to the gated power rail according to a sequence determined by a comparator circuit and one or more cascaded latches.

19 Claims, 7 Drawing Sheets

(56) References Cited

U.S. PATENT DOCUMENTS

| | | |
|---|---|---|
| 2012/0087199 A1 | 4/2012 | Tejada |
| 2013/0069690 A1 | 3/2013 | Kim et al. |
| 2013/0099570 A1 | 4/2013 | Manohar et al. |
| 2014/0340122 A1 | 11/2014 | Savanth et al. |
| 2016/0012867 A1 | 1/2016 | Chhabra |
| 2016/0018873 A1 | 1/2016 | Fernald et al. |

OTHER PUBLICATIONS

Lee, Hyoung-Wook, et al., "Power-Gating Structure with Virtual Power-Rail Monitoring Mechanism", Journal of Semiconductor Technology and Science, vol. 8, No. 2, (Jun. 2008), 5 pgs.

* cited by examiner

FIG. 7

WAKE-UP CONTROL CIRCUIT FOR POWER-GATED INTEGRATED CIRCUITS

FIELD OF THE DISCLOSURE

This document pertains generally, but not by way of limitation, to electronic circuits, and more particularly, to power-gated circuits.

BACKGROUND

Advances in semiconductor device fabrication processes have been driven by, amongst other things, the need to produce increasingly powerful electronic devices while adhering to stringent power consumption requirements. Reductions in the device feature sizes that characterize these fabrication processes drives the creation of these electronic devices by increasing, for example, the component or transistor density of the integrated circuits that are used to construct such devices. Such increases in component density, however, can come at the cost of increased power dissipation, such as caused by component leakage or by the increased functionality that may be built into a given integrated circuit. Such increases in power dissipation may make it difficult to design electronic devices that adhere to a specified set, or class, of power consumption requirements. This limitation can be overcome by building electronic devices, or fabricating electronic circuits, that incorporate one or more power gating techniques.

Power gating can reduce the amount of power consumed in a circuit by creating a gated power rail that can be disconnected from a power supply to cut off current to one or more sub-circuits, such as during periods when the functionally provided by such sub-circuits is not needed. Reconnecting a gated power rail to a power supply can generate current spikes which can cause reliability problems in some electronic devices. Techniques for limiting these current spikes can require the addition of complicated circuitry to devices that incorporate power gating, such as for generating voltage references or biasing comparator circuits.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a wake-up control circuit for control the amount of current that flows into a power-gated circuit during a wakeup process, thereby limiting the generation of transient currents in a power supply. Such transient currents can cause power supply noise, corrupt the state of digital devices, and lead to device reliability problems. The control circuit improves upon other wakeup control circuits by eliminating the need for analog circuitry for generating voltage references or for biasing comparator circuits. This reduces the size, and the component count, of the control circuit, thereby reducing the cost and complexity of circuits or electronic devices that incorporate power gating in their architecture.

The present disclosure describes, among other things, techniques (e.g., circuits, systems, and methods) for controlling the amount of current that flows into a power-gated circuit. Such techniques can include a wake-up control circuit or power gating circuit (hereinafter, "control circuit") that is disposed outside of a gated circuit between a power supply and a gated power rail. The control circuit can include a pair of field effect transistors (FETs) configured as an analog comparator, such as to measure or monitor the voltage on the gated power rail during a device power-up process and to generate a trigger signal after such voltage rises to within a threshold value of a target gated power rail voltage. The power switch can also include one or more latches and one or more transistors. The one or more latches can be cascaded, such as to form a shift register. At least one of the one or more transistors can have a smaller impedance than the remaining transistors, so that the total equivalent resistance of the switch is small to allow a low voltage drop (IR drop) during the active state. The trigger signal generated by the comparator can cause the one or more latches to sequentially actuate the one or more transistors, such as to cause each of the one or more transistors to couple the power supply to the gated power rail. The transistor of the one or more transistors having the smallest impedance can be the last transistor actuated, and can be used to generate a control signal, such as a ready signal, to activate one or more power-gated circuits.

As previously noted, these techniques improve on previous wake-up control or power gating circuits by eliminating the need for additional circuitry to generate reference voltages or to provide external biasing for comparators. In some embodiments, a wakeup control circuit that is configured according the techniques of the present disclosure can include fewer switching devices, such as fewer than 10, than wake-up control circuits or power gating circuits configured according to other techniques, which may include hundreds of switches. The elimination of this additional circuitry can reduce the chip size of a control circuit fabricated according to these techniques by 90% over other wake-up control circuits. Additionally, control circuits fabricated according to the techniques of the present disclosure can consume 80% less power than other wake-up control circuits. In some embodiments, a wakeup control circuit or power gating circuit that is configured according the techniques of the present disclosure may be disposed external to, or outside of, a gated circuit.

An electronic device that uses power gating techniques can have one or more circuits connected to a gated power rail. Such electronic device can be in an active mode, or an active operation mode, when such one or more circuits are powered by the gated power rail, such as to enable these circuits execute their intended function. Such electronic device may be in a low-power mode, or a lower power operating mode, when at the gated power rail is inhibited from supplying at least one of the one or more circuits with the power required by these circuits to operate. In some electronic devices, transitioning to a low-power mode can include deactivating one or more circuits, or disabling one or more gated power rails.

Figure 1A:
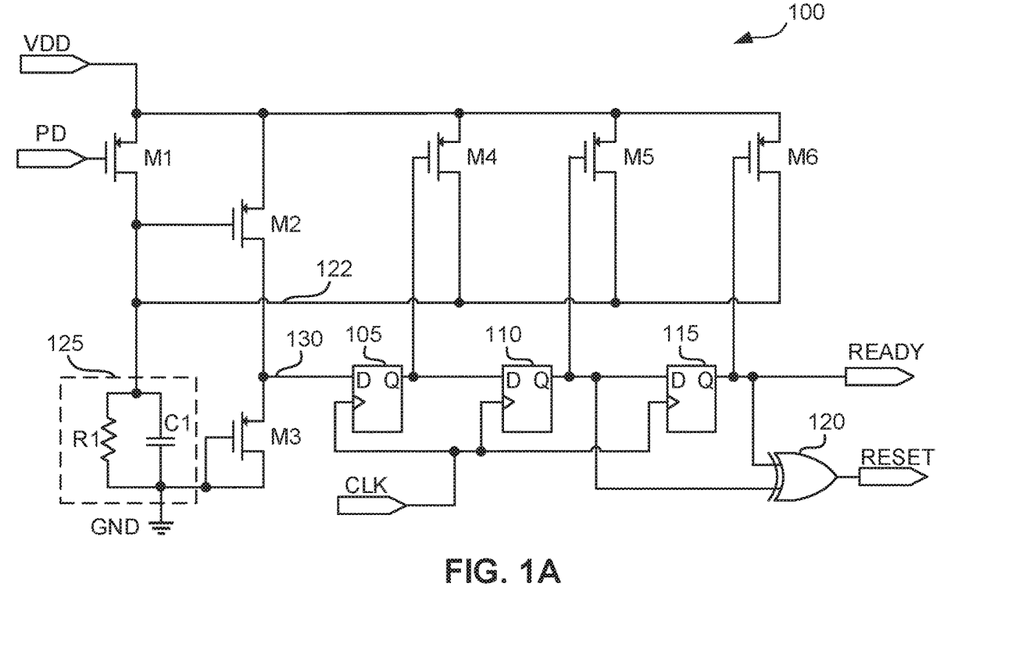
FIG. 1A depicts a diagram of an example of a wake-up control circuit for power-gated integrated circuits, according to various embodiments.

FIG. 1A depicts a diagram of an example of a wake-up control circuit 100 for power-gated circuits, according to various embodiments. The control circuit 100 can include transistors M1, M4, M5 and M6. The control circuit 100 can also include a comparator made with transistors M2 and M3, M2 acting as a variable current source and M3 as a resistor. In some embodiments, M2 can be any circuit configured to operate as a voltage controlled current source. The control circuit 100 can also include latches 105, 110, and 115. The control circuit 100 can further include a logic circuit 120. In some embodiments, the control circuit 100 can be coupled to a gated power rail 122 and to a load or gated circuit 125, such as modelled by resistor R1 and capacitor C1. The transistors M1, M2, M3, M4, M5 and M6 can be p-type FETs or other semiconductor devices. In some embodiments M3 can be a resistor. The latches 105, 110, and 115 can be set (e.g., one or more) of any type of latching circuit, such as a set of D-flip-flop or a serial register, configured in a cascaded arrangement, as described herein.

The transistor M1 can be a high impedance transistor configured to controllably couple the power supply VDD to the gated power rail 122 after, or in response to, receiving the control signal PD, such as a power-down or wake-up control signal. The transistor M1 can disconnect, or uncouple, the power supply VDD from the gated power rail 122 when the control signal PD is at a high voltage (hereinafter, "high"), such as when an electronic device or other control circuit places a circuit that is powered by the gated power rail in a low-power mode. The transistor M1 can connect, or couple, the power supply VDD to the gated power rail 122 when the control signal PD is at a low voltage (hereinafter, "low"), such as when an electronic device or other control circuit places a circuit that is powered by the gated power rail in an active, or normal, operating mode. After receiving, or detecting, a high to low voltage transition in the control signal PD, the transistor M1 can couple the power supply VDD to the gated power rail 122, such as to enable a small current to flow from VDD to the gated power rail. Such current can charge the gated power rail 122, such as by increasing the voltage on the gated power rail, at a rate determined by, among other things, the load 125 and the impedance of transistor M1. Coupling this current from the power supply VDD through transistor M1 can cause fluctuations in the power supply, which can manifest as current spikes, transient currents, or other noise. Such fluctuations can be limited, or reduced, by selecting the impedance, or the size or aspect ratio, of the transistor M1 to limit the coupled current below a specified value.

The transistors M4, M5, and M6 can be coupled in parallel with the transistor M1, such as to controllably couple the power supply VDD to the gated power rail 122. One or more of the transistors M4, M5, and M6 can have a lower impedance than the transistor M1, such as to enable such one or more transistors to couple a larger current from the power supply VDD to the gated power rail 122 than the current coupled by the transistor M1. By this operation, the time required to charge the gated power rail can be reduced. In some embodiments, the transistors M1, M4, M5, and M6 can be selected to cause the total current coupled from the power supply VDD to the gated power rail 122 after each of these transistors are closed to be at least as large as the maximum current required to be supplied by the gated power rail.

While the control circuit 100 show three transistors M4, M5, M6 coupled in parallel with transistor M1, other embodiments of the control circuit 100 can have one or more transistors coupled in parallel with the transistor M1. The total number of such transistors can be selected to cause the current coupled from the power supply VDD to the gated power rail 122 to be incrementally increased while limiting fluctuations in the power supply, such as by keeping power supply current spikes below a threshold value.

Transistors M2 and M3 can form a comparator circuit, such as for sensing or monitoring the voltage on the gated power rail 122 while the gated power rail is being charged by the current flowing through the transistor M1. The transistor M2 can have a source coupled to the power supply VDD, and a gate coupled to the gated power rail 122, such as to enable the comparator to sense the voltage on the gated power rail. The transistor M3 can be configured as a diode connected transistor, with a source coupled to the drain of the transistor M2, and a gate and drain coupled to ground rail GND.

The transistor M2 can be on while the control signal PD is high, such as during a low power mode, enabling a current to flow from the power supply VDD through the transistor M3 to the ground rail GND. This current can cause a voltage, such as a high voltage or logic one, to develop at the comparator output 130. This voltage can be captured by the latch 105 and propagated to latches 110 and 115, turning off the transistors M4, M5, and M6.

When the control signal PD transitions to a low value, such as during a transition from low-power mode to active mode, the voltage on gated power rail 122 can gradually transition high, such as due to the charging of the gated power rail though transistor M1. The transistor M2 can sense the change in the gated power rail voltage and gradually turn off, reducing the voltage developed across the transistor M3 at the comparator output 130. When the voltage on gated power rail 122 reaches a threshold value, such as between 250 mV and 50 mV of the active mode voltage of the gated power rail, the reduced voltage at 130 can be captured by the latch 105 and stored as a low value or logic zero. This low value can be sequentially propagated to latches 110 and 115, thereby sequentially turning on the transistors M4, M5, and M6.

Figure 4:
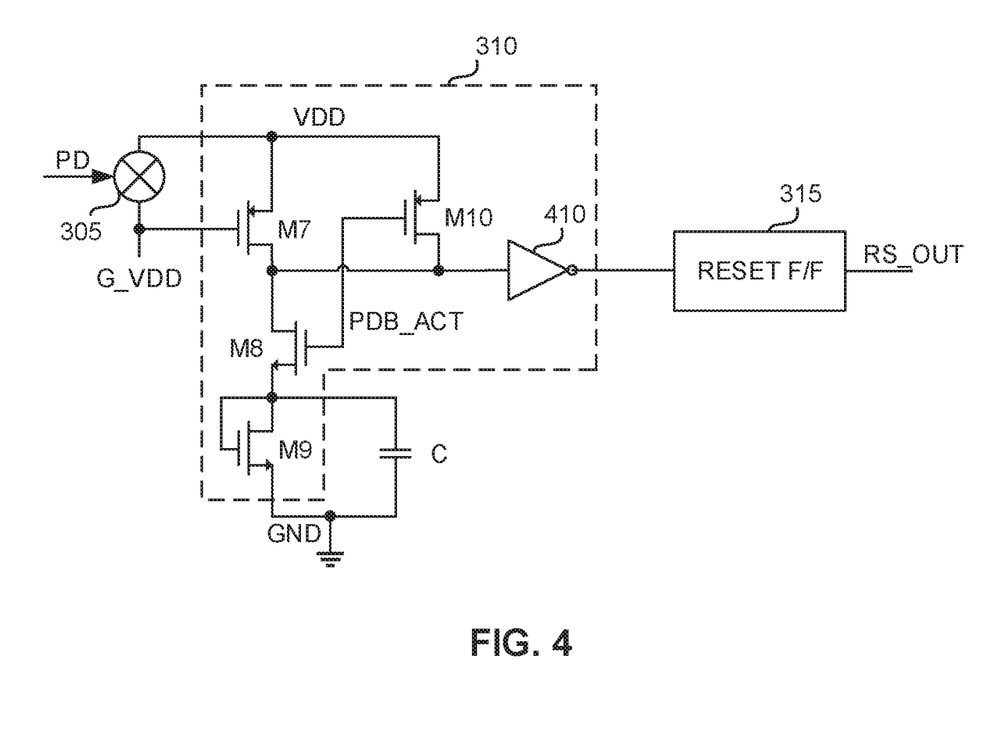
FIG. 4 depicts an example of an implementation of a comparator circuit used in the wake-up control circuit, according to various embodiments.

The transistor M2 and the transistor M3 can be sized to determine the gated power rail voltage level that causes the comparator output 130 to transition below the low value threshold voltage of the latch 105. Such sizing can include increase the size of at least the transistor M3, such as to reduce the gated power rail voltage level that causes the comparator output 130 to transition below the low value threshold voltage of the latch 105. Since the transistor M2 and the transistor M3 are both on while the control circuit 100 is in a low-power mode, these transistors can be further sized with consideration to limiting the leakage current generated by the control circuit 100. Such sizing can include reducing the size of these transistors to reduce leakage current. In some embodiments, additional circuitry incorporated in the comparator formed by M2 and M3 to reduce leakage while the circuit 100 in a low-power mode, as shown in FIG. 4. Such additional circuitry can be configured to reduce leakage without substantially affecting the threshold voltage at which the comparator output 130 transitions from low to high.

The latches 105, 110, and 115 can be cascaded, such as to have the output of latch 105 provide an input to latch 110, and the output of latch 110 provide an input to latch 115, while each latch can be simultaneously clocked, such as by a high frequency clock signal CLK. Such high frequency clock signal can be generated by a clock circuit having a clock frequency on the order of 0.1 to 10 megahertz. In some embodiments, the control circuit 100 can include such a clocking circuit. In other embodiments, the clock signal CLK can be provided by a clock circuit disposed within an always on circuit of an electronic device that incorporates the control circuit 100. Such clock circuits can be power by a power source other than the gated power rail 122. Such clock circuits can be free running, such as to generate the clocking signal CLK in both an active mode and a low-power mode. Alternatively, such clock circuits can be triggered to generate the clocking signal CLK in an active operating mode, such as in response to the control signal PD having a low value. A frequency of the high frequency clock signal CLK can be selected based on, among other things, the load 125, the sizes of the transistors M4, M5, and M6, or a specified power up time for circuits power-gated by the control circuit 100.

The latches 105, 110, and 115 can each have an output coupled to the gate a gate of one of the transistors M4, M5, or M6, such as to turn off the transistors when their respective latch stores a high value and to turn on the transistors when their respective latch stores a low value. While the control circuit 100 is in a low-power mode, the latches 105, 110, and 115 are set high, such as by the output of the comparator formed by the transistor M2 and M3, such as to inhibit current from flowing from the power supply VDD to the gated power rail 122 though the transistors M4, M5, or M6. When the control circuit 100 is transitioned to an active operating mode, the latch 105 can capture a low value from the output of the comparator formed by transistors M2 and M3, as described herein. The captured low value can be provided at the output Q of latch 105 to turn on transistor M4, such as to couple the power supply VDD to the gated power rail 122, such as to create a path for current to flow from the power supply VDD to the gated power rail through the transistor M4. The low value by latch 105 can then be sequentially propagated from latch 105 to latch 110, and from latch 110 to latch 115 until each latch stores a low value. Such sequential propagation of the low value through the latches can turn on transistors M4, M5, and M6, such as to sequentially couple the power supply VDD to the gated power rail 122 through each of the transistors. The rate at which the low value is propagated though the latches, and hence the rate at which each transistor couples the power supply VDD to the gated power rail 122, can be determined by the clock signal CLK.

While the control circuit 100 shows three latches 105, 110, and 115 configured to actuate the transistors M4, M5, and M6 to sequentially couple the power supply VDD to the gated power rail 122, other embodiments of the control circuit 100 can have one or more latches configured to actuate one or more transistor M4, M5, and M6. The total number of such latches can be selected to match the number of transistors configured in parallel with the transistor M1, as described herein.

The logic circuit 120 can be any logic circuit configured to provide a reset signal RESET, such as to reset or initialize one or more circuits gated by the control circuit 100. The logic circuit 120 can provide the reset signal after the gated power rail reaches a threshold voltage level, or after the gated power rail is able to source a threshold amount of current. Such logic circuit can include one or more logic gates, such as the exclusive-OR gate, having inputs coupled to an output of the latch 110 and the latch 115. Such a logic circuit can provide a reset signal RESET after turning on transistor M5 and can discontinue the reset signal RESET after turning on latch 115. Other logic circuits or other configurations of logic gates can be used to provide a specified reset signal RESET.

In some embodiments, the control circuit 100 can also provide a ready signal READY, such as to indicate that the gated power rail 122 has reached a stable threshold voltage level, or that the gated power rail can source a threshold amount of current. In some embodiments, the ready signal READY can be provided by the output the last transistor to be turned on by the cascaded latches, such as M6. This last transistor can be a low impedance switch, such as a transistor have an on impedance of less than 10 ohms.

In some embodiments, the transistors used in the present disclosure can be field effect transistors, other transistors, switching devices, or switching circuits configured to implement the techniques of the present disclosure.

Figure 1B:
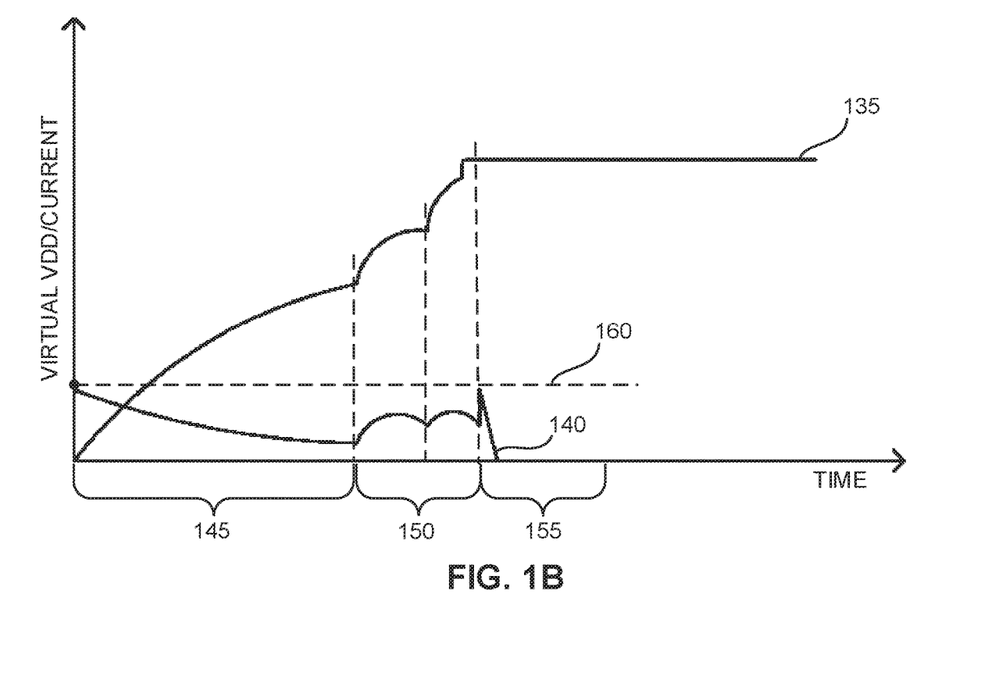
FIG. 1B depicts a waveform diagram of signals in an example wake-up control circuit for power-gated integrated circuits, according to various embodiments.

FIG. 1B depicts a waveform diagram of signals in an example wake-up control circuit for power-gated circuits. Such wake-up control circuit can be an embodiment of the control circuit 100 (FIG. 1A). The waveform diagram includes time-amplitude plots of a gated power rail voltage 135, such as the voltage of the gated power supply 122 (FIG. 1A), and power supply current 140, such as the current drawn from the power supply VDD, as generated by a transition of the control circuit 100 from a low-power mode to an active mode. As can be seen in the diagram, the control circuit 100 can charge the gated power rail 122, such as to transition a power gated circuit to an active operation mode, while limiting current spikes below a specified threshold value 160.

Region 145 of the waveform diagram shows the gated power rail voltage and the power supply current as the transistor M1 charges the gated power rail 122 to a threshold voltage determined by the comparator formed by transistors M2 and M3. Region 150 shows the gated power rail voltage and the power supply current as the transistor M4 and M5 are sequentially turned on by latches 105 and 110, such as to continue charging the gated power rail 122. Region 155 shows the gated power rail voltage and the power supply current as low impedance transistor M6 is turned on by latch 115, such as to finish charging the gated power rail 122.

Figure 2:
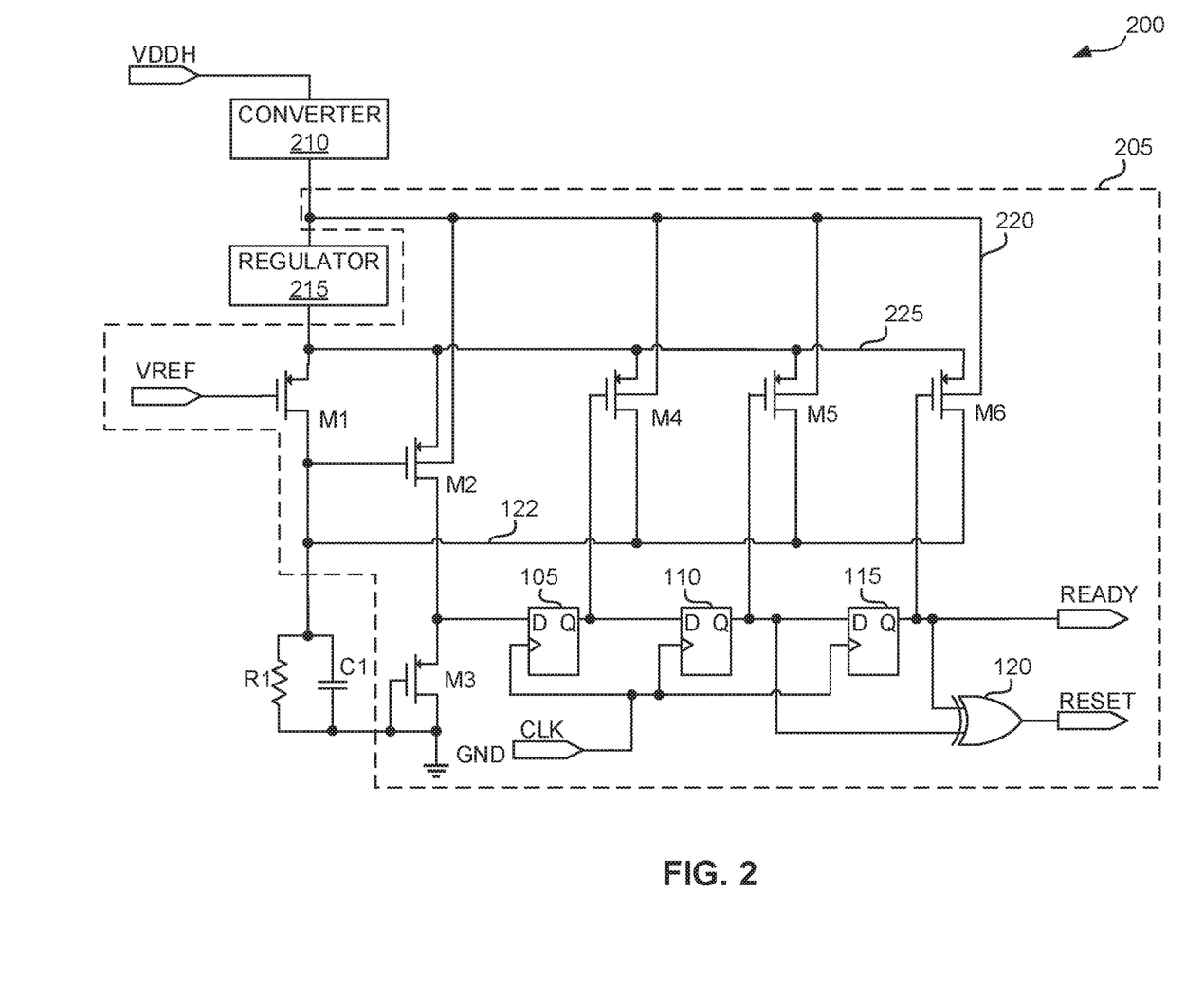
FIG. 2 depicts a diagram of an example of a device incorporating a wake-up control circuit for power-gated integrated circuits, according to various embodiments.

FIG. 2 depicts a diagram of an example of a system 200 having a wake-up control circuit 205 for power-gated circuits, according to various embodiments. The system 200 can be any electronic device or system that includes one or more power-gated circuits, such as modelled by the resistor R1 and capacitor C1. In some embodiments, the system 200 can include a circuit board having one or more power gated memory arrays, such as synchronous random-access memory arrays, such as by using the control circuit 205. The system 200 can include power a converter circuit 210, a regulator circuit 215, the control circuit 205, and the load modelled by resistor R1 and capacitor C1. The power converter circuit 210 can be any power converter circuit, such as a direct current to direct current converter or a linear regulator, that is configured to convert a high voltage source VDDH to an intermediate voltage. The regulator circuit 215 can be a voltage regulator circuit, such as a linear voltage regulator or a low dropout voltage regulator, configured to convert an intermediate voltage to an operating voltage at 225. In some embodiments, the high voltage VDDH can be 3 volts (V), the intermediate voltage generated by the converter circuit 210 can be 1.3V, and the operating voltage generated by the regulator circuit 215 can be 0.8V. The control circuit 205 can be an example of the control circuit 100, modified to couple the back-gates of transistors M1, M4, M5, and M6 to the intermediate voltage generated by the converter circuit 210 at 220, such as to reduce leakage through these transistors.

Figure 3:
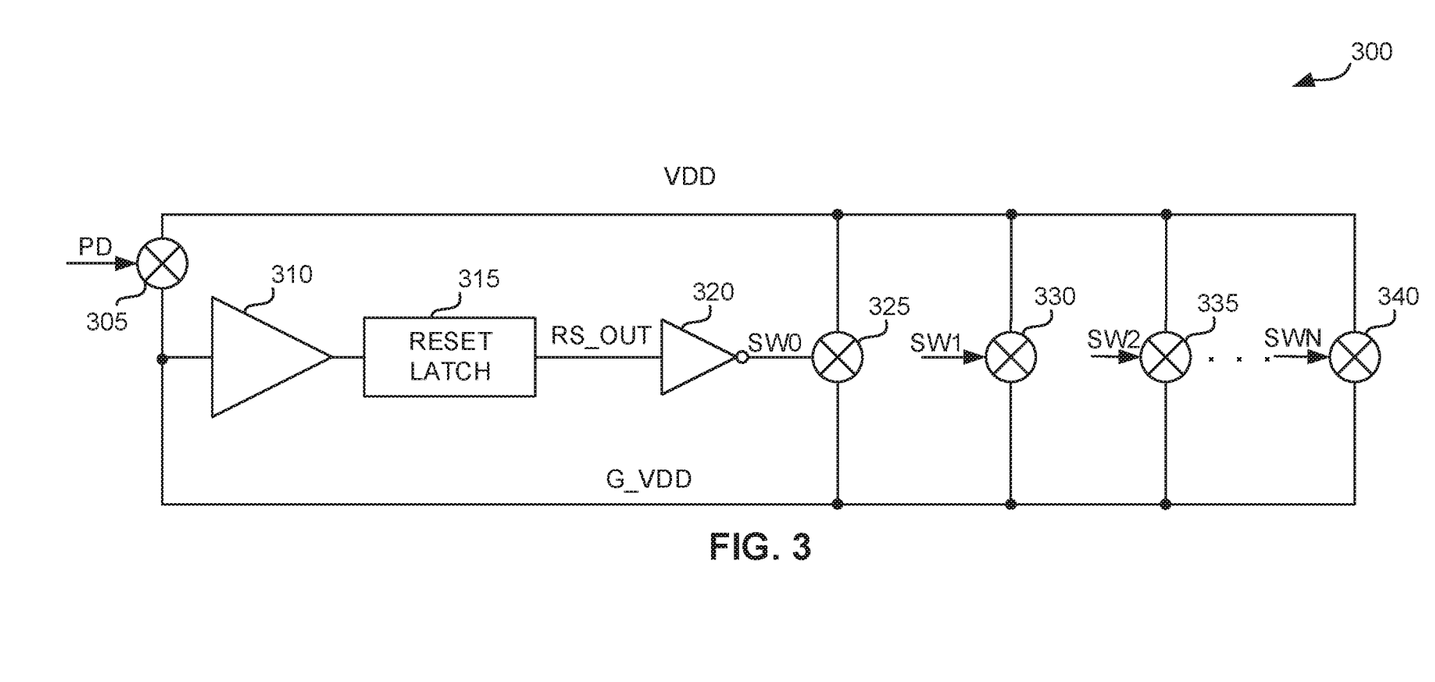
FIG. 3 depicts a block diagram of an example of a wake-up control circuit for power-gated integrated circuits, according to various embodiments.

FIG. 3 depicts a block diagram of an example of a wake-up control circuit 300 for power-gated circuits, according to various embodiments. The control circuit 300 can be a generalized embodiment of the control circuit 100 (FIG. 1A) or the control circuit 205 (FIG. 2). The control circuit 300 can include a high impedance transistor 305, and one or more medium or low impedance transistor 325, 330, and 335 through 340. The high impedance transistor 305 can be any switching circuit, such as transistors M1 (FIG. 1) having an on impedance that limits the maximum in-rush current, and configured to charge the gated power rail G_VDD after, or in response to, receiving specified voltage, such as a low voltage, on the control signal PD. The one or more medium or low impedance transistors 325, 330, and 335 through 340 can be any switching circuit having an on impedance that is lower than the on impedance of the high impedance transistor 305, such as the transistors M4, M5, and M6, and that is configured to sequentially couple the power supply VDD to the gated power rail G_VDD after being sequentially turned on by control signals SW0 through SWN. The control signal SW0 can be driven by the comparator 310, as described below, while the control signals SW1 through SWN can be driven by a sequence of cascaded latches, such as described in FIG. 5. At least one of the transistors 325, 330, and 335 through 340 can have a lower impedance than the transistor 305. The transistor having the lowest impedance is configured to be the last transistor to sequentially couple the power supply VDD to the gated power rail G_VDD, as described herein. The control circuit 300 can also include a comparator circuit 310, a latch 315, and an inverter 320. The comparator circuit 310 can be any comparator circuit, such as the comparator circuit formed by transistors M2 and M3 in FIG. 1A, configured to sense the voltage on gated power rail G_VDD and to provide a high output on RS_OUT when such voltage is transitions within, or exceeds, a threshold value of the active mode voltage of the gated power rail. The latch 315 can be any latching circuit, such as the latching circuit 105 in FIG. 1A or an asynchronous latching circuit, configured to capture an output of comparator 310 on RS_OUT and to drive the transistor 325 through the inverter 320.

FIG. 4 depicts an example of an implementation of a comparator circuit 310 used in a wake-up control circuit, such as the control circuit 300. The comparator circuit 310 can include a transistor M7, such as a p-type FET, configured to sense the voltage on the gated power rail G_VDD, a diode connected transistor M9, such as an n-type FET, and an inverter circuit 410. The transistor M7 and the diode connected transistor M9 can operate substantially the same as the transistor M2 and the transistor M3 in FIG. 1A, such as to generate a high voltage at the input of the inverter 410 when the control signal PD is high, and a low voltage at the input of the inverter when the control signal PD is low and the voltage on the gated power rail G_VDD is within a threshold voltage of the active mode voltage of the gated power rail. The inverter 410 can operate as a driver to provide a strong one (e.g., high voltage) or zero (e.g., low voltage) to the latch 315. The comparator circuit 310 can also include a transistor M8, such as an n-type FET, and a transistor M10, such as a p-type FET. These transistors can be driven by the control signal PDB_ACT, such as to reduce leakage current generated by the comparator circuit 310. The control signal PDB_ACT can be generated by a support logic circuit included in the sequential logic circuit described in FIG. 5.

Figure 5:
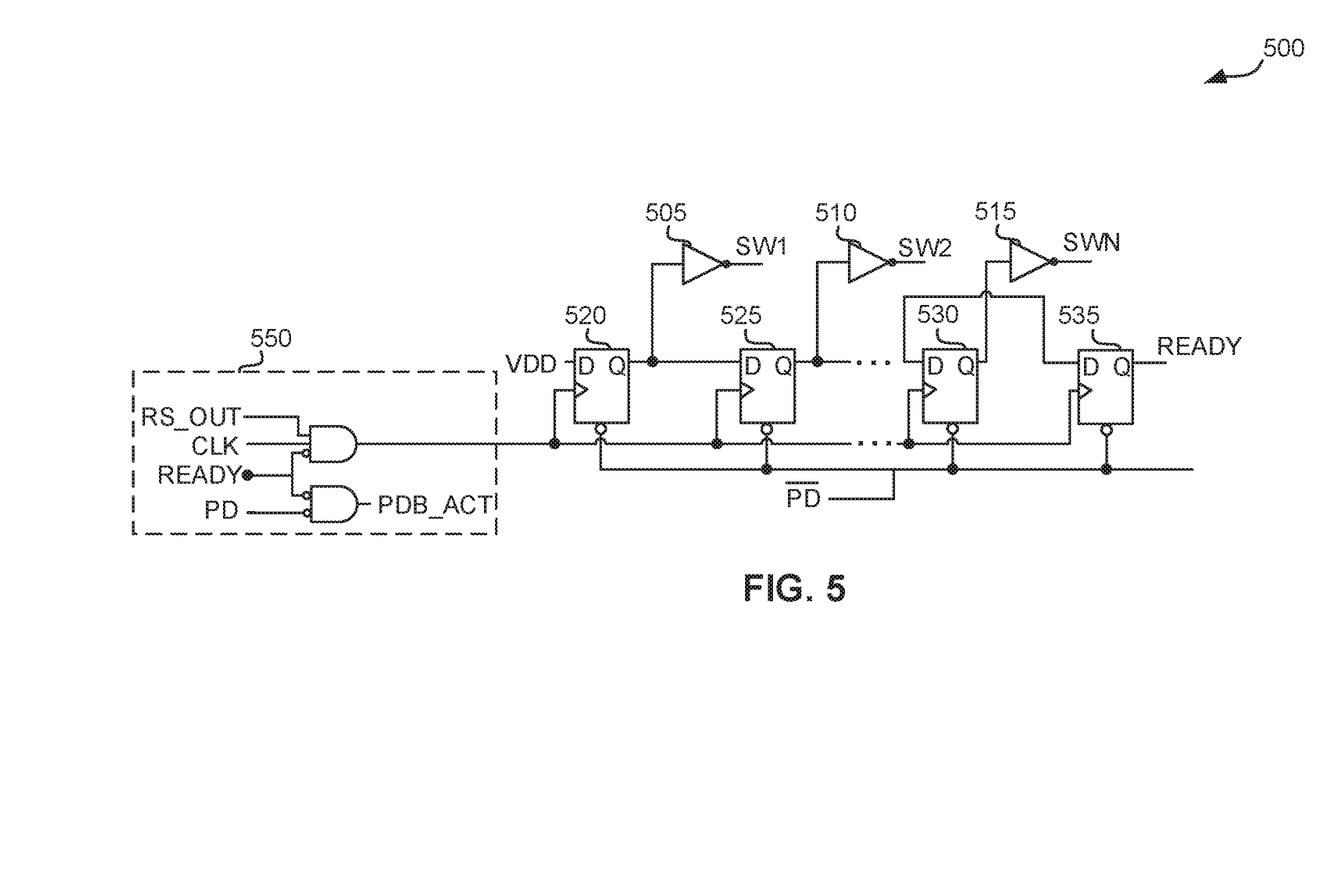
FIG. 5 depicts a diagram of an example of a sequential component of a wake-up control circuit for power-gated integrated circuits, according to various embodiments.

FIG. 5 depicts a diagram of an example of a sequential logic circuit 500 included in a wake-up control circuit for power-gated circuits, according to various embodiments. The sequential logic circuit 500 can generate the control signals SW1, and SW2 though SWN, such as to drive the one or more moderate or low impedance transistors shown in FIG. 3. The sequential logic circuit 500 can include one or more inverters 505, and 510 through 515 coupled to one or more cascaded latches 520, and 525 through 530. The sequential logic circuit 500 can also include the latch 535, and a support logic circuit 550.

When the control signal PD is high, such as when an electronic device or circuit that incorporates the control circuit 300 is in a low-power mode, the latches 520, and 525 through 530, and 535 can be reset to store a low value, such as to drive the read signal READY low and to cause the inverters 505, and 510 through 515 to drive the control signals control signals SW1, and SW2 though SWN to high. While the control signal PD is high, the medium or low impedance transistors 325, 330, and 335 through 340 can be open, decoupling the power supply VDD from the gated power rail G_VDD, such as by inhibiting current flow from the power supply to the gated power rail through these transistors. Additionally, while PD is high, the sequential logic circuit 550 can drive the control signal PDB_ACT low, such as to inhibit current flow from transistor M7 through resistor M9, while forcing the output RS_OUT of latch 315 high.

When the control signal PD transitions to low, such as when an electronic device or circuit that incorporates the control circuit 300 transitions to an active or normal operating mode, the support logic circuit 550 can drive the control signal PDB_ACT high, such as to enable current flow from transistor M7 through resistor M9, such as to enable the latch 315 to provide a high output on RS_OUT after the voltage of the gated power rail G_VDD transitions to within a threshold voltage of the active mode operating voltage of the gated power rail. The high value on RS_OUT can cause the support logic circuit 550 to clock the latches 520, and 525 through 530, such as to propagate VDD sequentially through the cascaded latches, such as to sequentially close the medium or low impedance transistors 325, 330, and 335 through 340, such as to sequentially couple the power supply VDD to the gated power rail G_VDD. Once VDD is propagated to latch 530, latch 535 can drive the ready signal READY high, disabling the clocking output of the support logic circuit 550. Driving the ready signal READY high can also inhibit current flow from transistor M7 through resistor M9, while forcing the output RS_OUT of latch 315 high.

Figure 6:
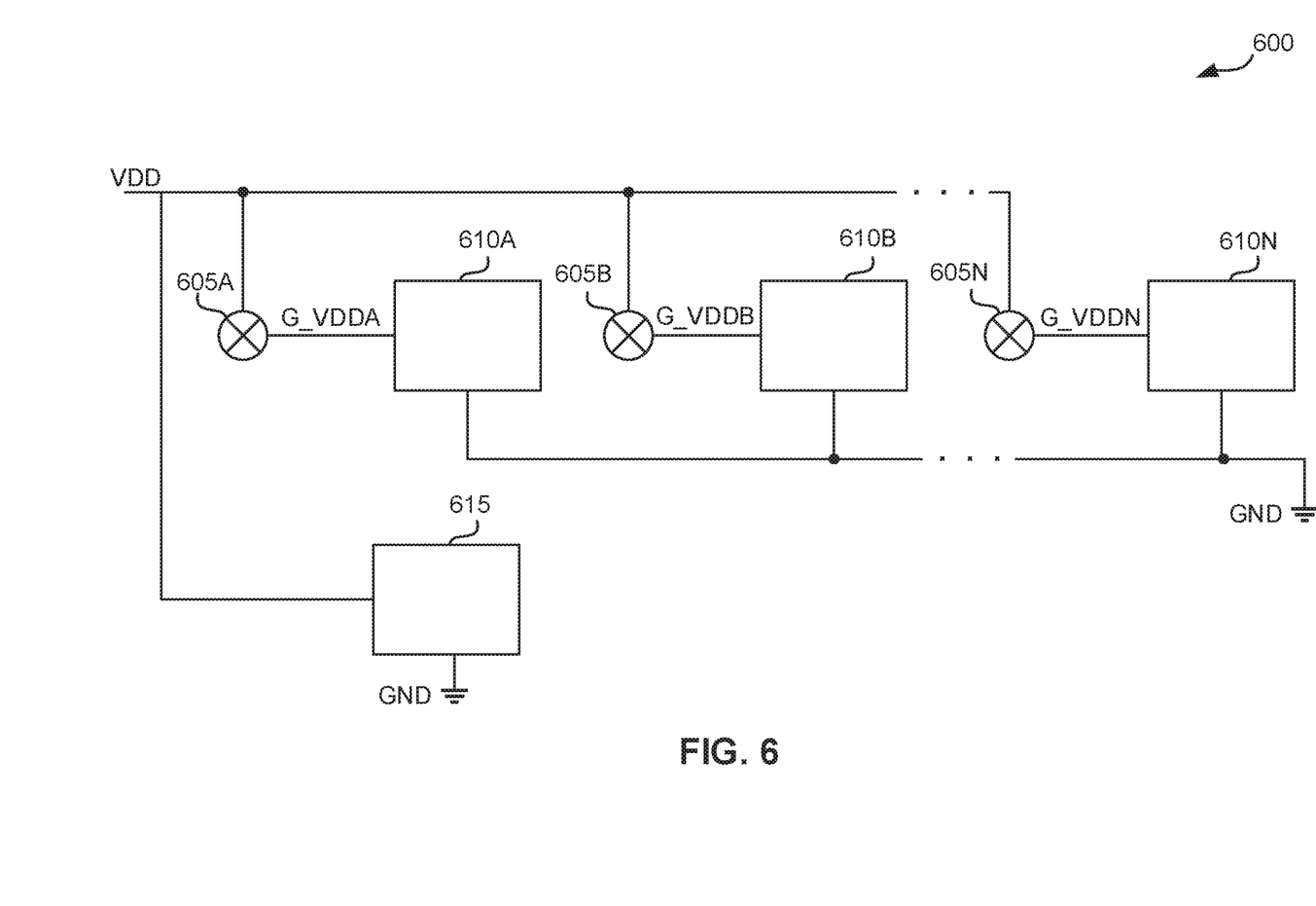
FIG. 6 depicts a diagram of example of a system incorporating wake-up control circuit for power-gated integrated circuits, according to various embodiments.

FIG. 6 depicts a diagram of example of a system 600 incorporating a wake-up control circuit for power-gated circuits, according to various embodiments. The system 600 can be an example of an electronic device or circuit having one or more power gated circuits 610A, and 610B through 610N, coupled to gated power rails G_VDDA, and G_VDDB through G_VDDN, respectively. The gated power rails G_VDDA, and G_VDDB through G_VDDN can be controllably coupled to the power supply VDD using one or more wake-up control circuits 605A, and 605B through 605N. Such wake-up control circuits can include the control circuit 100, the control circuit 205, or the control circuit 300. The system 600 can further include an always on circuit 615 coupled to the power supply VDD. Such always on circuit can include a high frequency clock circuit, as described herein.

Figure 7:
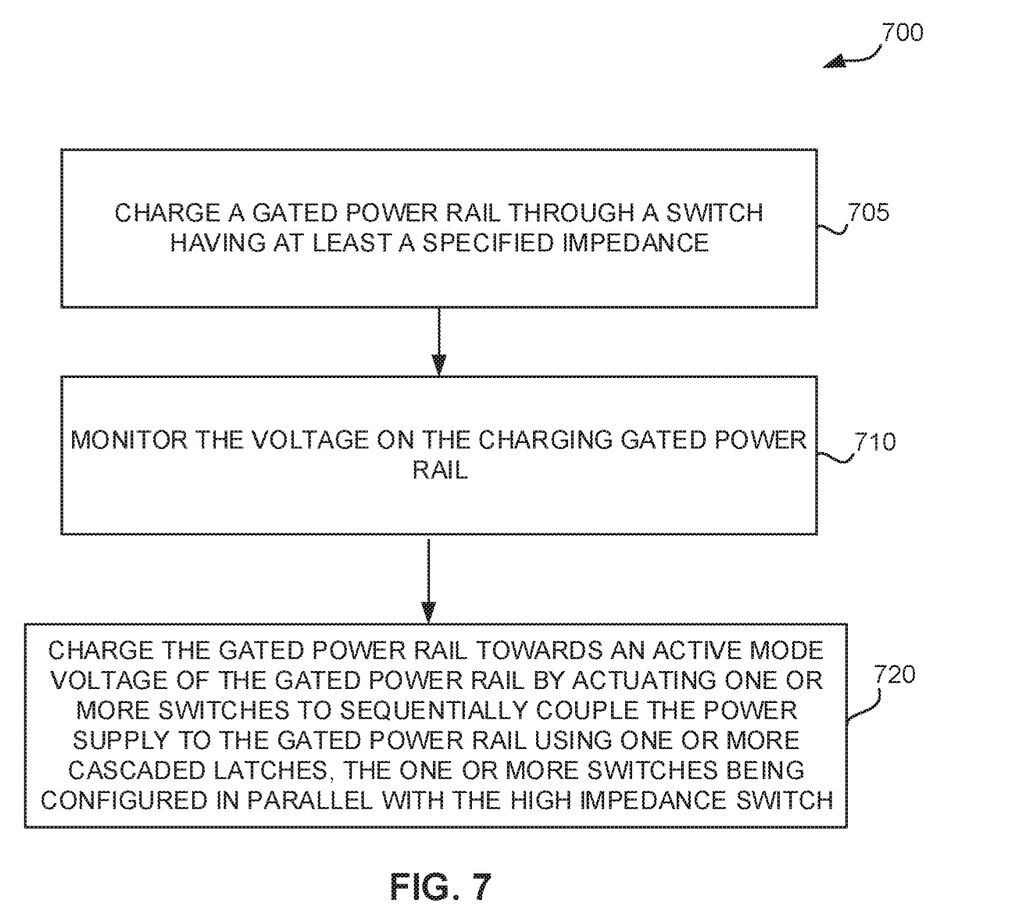
FIG. 7 depicts a process for operating a wake-up control circuit for power-gated integrated circuits, according to various embodiments.

FIG. 7 depicts a process 700 for operating a wake-up control circuit for power-gated circuits, according to various embodiments. The process 700 can be executed to limit current spikes in a power supply of an electronic device when transitioning the electronic device from a low-power mode to an active mode. Such electronic device can include one or more power-gated circuits, as described herein.

The one or more powered gated circuits can be controlled by a wake-up control circuit, such as the control circuit 100 (FIG. 1A), the control circuit 205 (FIG. 2), or the control circuit 300 (FIG. 3).

At 705, a gated power rail can be charged using a transistor having at least a specified impedance, such as a FET having an on impedance determined by the maximum allowed in-rush current. Such power rail can be charged by actuating the transistor to couple the power supply to the gated power rail after, or in response to, receiving a control signal having a specified value, such as a low value on the control signal PD (FIG. 1).

At 710 the voltage on the charging gated power rail can be monitored, such as by any of the comparator circuits described herein, such as to determine when the gated power rail voltage charges to a threshold voltage level. In some embodiments, the threshold voltage level can be a voltage within 250 mV to 50 mV of an active mode gated power rail voltage, such as 0.8V.

At 715, after the gated power rail voltage charges to within the threshold voltage level, the gated power rail can be further charged towards the active mode voltage of the gated power rail, such as by actuating one or more transistors to sequentially couple the power supply to the gated power rail using one or more cascaded latches. Such one or more transistors can be configured in parallel with the transistor have as much the specified impedance, as described herein. At least one of the one or more transistors have a lower impedance than the specified impedance. In certain embodiments, the one or more latches can be synchronously clocked to sequentially actuate the one or more transistors using clock having a specified clock frequency.

VARIOUS NOTES & EXAMPLES

Each of the non-limiting aspects or examples described herein may stand on its own, or may be combined in various permutations or combinations with one or more of the other examples. To better illustrate the method and apparatuses disclosed herein, a non-limiting list of embodiments is provided here: Example 1 is a wake-up power control switch circuit for coupling a hibernate-able supply bus with a supply source, the circuit comprising: a first transistor having a first impedance configured to receive a wake-up signal, to control an inrush current to the hibernate-able supply bus, and to raise a voltage of the hibernate-able supply bus using the inrush current and a capacitance of one or more loads coupled to the hibernate-able supply bus; a sequential circuit configured to receive a clock signal and to activate an output in response to a first voltage level of the voltage of the hibernate-able supply bus; and a second transistor having a second resistance configured to receive the output of the sequential circuit, and to couple the supply source with the hibernate-able supply bus, wherein the second transistor has a lower impedance than the first impedance of the first transistor.

In Example 2, the subject matter of Example 1 optionally includes a current source configured to receive the voltage of the hibernate-able supply bus and to trigger the sequential circuit upon the voltage of the hibernate-able supply bus reaching the first voltage level.

In Example 3, the subject matter of Example 2 optionally includes wherein the first voltage level is a threshold voltage of the sequential circuit.

In Example 4, the subject matter of Example 3 optionally includes where the current source includes a first source transistor configured to source current to a current source load to provide an input voltage to the sequential circuit, wherein the input voltage is indicative of the first voltage level.

In Example 5, the subject matter of Example 4 optionally includes a second transistor configured to disable a current path of the current source between the first transistor and the current source load to save power when the second transistor is enabled or when the hibernate-able supply bus is hibernating.

In Example 6, the subject matter of Example 1 optionally includes wherein the sequential circuit includes a first flip-flop.

In Example 7, the subject matter of Example 6 optionally includes wherein the first voltage level is a threshold voltage of the first flip-flop.

In Example 8, the subject matter of Example 6 optionally includes wherein the sequential circuit includes a plurality of flip-flops and the plurality of flip-flops includes the first flip-flop.

In Example 9, the subject matter of Example 8 optionally includes a third transistor coupled in parallel with the first transistor; and a second flip-flop of the plurality of flip-flops configured to receive an output of the first flip-flop; and wherein the third transistor is responsive to an output of the second flip-flop.

In Example 10, the subject matter of Example 1 optionally includes a third flip-flop configured to receive an output of the second flip-flop and having an output coupled to a gate of the third transistor.

In Example 11, the subject matter of Example 1 optionally includes wherein the sequential circuit is configured to receive power from the hibernate-able supply bus.

Example 12 is method of waking a hibernate-able supply bus, the method including: initiating a first current and a first voltage rise of the hibernate-able supply bus via a first power transistor coupled between the hibernate-able supply bus and a second supply bus; limiting the first current and the first voltage rise using an on-resistance of the first power transistor and a capacitance of a load coupled to the hibernate-able supply bus; triggering an input of a sequential circuit at a first voltage level of the first voltage rise; receiving an output of the sequential circuit at a gate of a second power transistor; and coupling the second supply bus with the hibernate-able supply bus using the second power transistor, wherein the second power transistor includes a lower on-resistance than the first power transistor.

In Example 13, the subject matter of Example 12 optionally includes wherein the triggering an input of a sequential circuit includes triggering an input of a first flip-flop of the sequential circuit, wherein the first voltage level is a threshold voltage of the first flip-flop.

In Example 14, the subject matter of Example 13 optionally includes wherein the triggering an input of a sequential circuit includes receiving a clock signal at the first flip-flop and triggering an output of the first flip-flop on a first transition of the clock signal when the input of the first flip-flop is at the first voltage level.

In Example 15, the subject matter of Example 14 optionally includes receiving the output of the first flip-flop at a gate of the second power transistor.

In Example 16, the subject matter of Example 14 optionally includes receiving a representation of the output of the first flip-flop at a second flip-flop and triggering an output of the second flip-flop on a second transition of the clock signal.

In Example 17, the subject matter of Example 16 optionally includes wherein the receiving the output of the sequential circuit includes receiving the output of the second flip-flop at the second power transistor.

In Example 18, the subject matter of Example 17 optionally includes wherein initiating a first current and first voltage rise of the hibernate-able supply bus includes receiving a wake-up signal at a gate of the first power transistor.

In Example 19, the subject matter of Example 18 optionally includes wherein the triggering of an input of the sequential circuit includes: receiving a voltage of the hibernate-able supply bus at a gate of a current source transistor; receiving current sourced by the current source transistor at a comparator load; decreasing the current sourced by the current source transistor in response to the first voltage rise; and triggering the input of the sequential circuit in response to a voltage drop across the comparator load as the current sourced by the current source transistor decreases.

In Example 20, the subject matter of Example 19 optionally includes AND-ing the output of the second flip-flop with the wake-up signal; and interrupting a path of current from the current source transistor to conserve power.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A power gating circuit, comprising:
   a first transistor to couple a power supply to a gated power rail responsive to receiving a control signal;
   one or more transistors coupled in parallel with the first transistor, wherein:
      the one or more transistors are configured to sequentially couple the power supply to the gated power rail according to a sequence determined by one or more cascaded latches, and
      at least one latch of the one or more cascaded latches is configured to receive a signal to determine an interval at which the one or more transistors sequentially couple the power supply to the gated power rail; and
   a comparator circuit configured to initiate the sequential coupling responsive to the gated power rail exceeding a threshold voltage.

2. The power gating circuit of claim 1, wherein at least one transistor of the one or more transistors has a lower on impedance than the first transistor.

3. The power gating circuit of claim 1, wherein the comparator circuit has an input coupled to the gated power rail and an output coupled a first latch of the one or more cascaded latches.

4. The power gating circuit of claim 1, wherein the comparator circuit comprises a voltage controlled current source serially coupled to a resistive element.

5. The power gating circuit of claim 4, wherein the voltage controlled current source is a field effect transistor and the resistive element is at least one of a diode connected field effect transistor or a resistor.

6. The power gating circuit of claim 1, further including the one or more cascaded latches.

7. The power gating circuit of claim 1, further comprising a clock circuit to clock the one or more cascaded latches, the clock circuit configured to receive power from a power source other than the gated power rail.

8. The power gating circuit of claim 1, wherein sequentially coupling the power supply to the gated power rail according to a sequence determined by the one or more cascaded latches limits a current drawn from the power supply below a threshold current while a voltage of the gated power rail changes towards a voltage of the power supply.

9. The power gating circuit of claim 1, further comprising a reset circuit configured to indicate, based on at least one transistor of the one or more transistors, that a voltage of the gated power rail is higher than a threshold voltage.

10. The power gating circuit of claim 1, further comprising a linear regulator to provide the power supply.

11. An electronic device having an active mode and a low-power mode, the electronic device comprising:
   a gated power rail to power a gated circuit during the active mode; and
   a power gating circuit configured to couple a power supply to the gated power rail, the power gating circuit comprising:
   a first transistor to couple the power supply to the gated power rail responsive to receiving a control signal, and
   one or more transistors to sequentially couple the power supply to the gated power rail at an indicated clock interval according to a sequence determined by one or more synchronously clocked latches; and
   a comparator circuit configured to actuate the one or more transistors to sequentially couple the power supply to the gated power rail after the gated power rail transitions to a threshold voltage.

12. The electronic device of claim 11, further comprising:
   a clock circuit coupled to the power supply and to the one or more latches, the clock circuit configured to synchronously clock the one or more latches to sequentially actuate the one or more transistors at an indicated frequency.

13. The electronic device of claim 11, wherein the comparator circuit comprises:
   a sensing transistor to sense a voltage on the gated power rail, and
   at least one of a diode connected transistor and a resistor coupled in series with the sensing transistor to generate an output voltage in responsive to the sensed voltage on the gated power rail.

14. The electronic device of claim 13, wherein the comparator circuit further comprises:
   at least one transistor configured to reduce the current consumed by power gating circuit based on the received control signal.

15. The electronic device of claim 11, wherein the power gating circuit is configured to limit current spikes in the power supply below a threshold value when the electronic device transitions from the low-power mode to the active mode.

16. The electronic device of claim 11, further comprising a reset circuit configured to indicate, based on at least one transistor of the one or more transistors, whether a voltage of the gated power rail is higher than a threshold voltage.

17. The electronic device of claim 11, wherein the comparator circuit comprises a voltage controlled current source coupled in series with a resistive element.

18. A method for limiting current spikes in a power supply of an electronic device when the electronic device transitions from a low-power mode to an active mode, the method comprising:
   charging a gated power rail by coupling the power supply to the gated power rail using a transistor having at least a specified impedance;
   monitoring a voltage of the gated power rail to determine when the gated power rail charges to a threshold voltage level; and
   charging the gated power rail towards an active mode voltage of the gated power rail by actuating one or more transistors to sequentially couple the power supply to the gated power rail using one or more cascaded latches, wherein:
   the one or more transistors are configured in parallel with the transistor, and
   the one or more latches are synchronously clocked to sequentially actuate the one or more transistors at an indicated frequency.

19. The method of claim 18, wherein at least one of the one or more transistors has a lower impedance than the specified impedance.

* * * * *